United States Patent
Sakumura et al.

(10) Patent No.: US 11,107,539 B2
(45) Date of Patent: Aug. 31, 2021

(54) SEMICONDUCTOR DEVICE AND ITS POWER SUPPLY CONTROL METHOD

(71) Applicant: RENESAS ELECTRONICS CORPORATION, Tokyo (JP)

(72) Inventors: Kotaro Sakumura, Tokyo (JP); Hiroshi Tachibana, Tokyo (JP); Hideki Otsu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/702,167

(22) Filed: Dec. 3, 2019

(65) Prior Publication Data

US 2020/0211658 A1    Jul. 2, 2020

(30) Foreign Application Priority Data

Dec. 26, 2018  (JP) .............................. JP2018-242324

(51) Int. Cl.
   *G11C 16/30*    (2006.01)
   *G11C 16/10*    (2006.01)
   (Continued)

(52) U.S. Cl.
   CPC .............. *G11C 16/30* (2013.01); *G06F 3/064* (2013.01); *G06F 3/0604* (2013.01);
   (Continued)

(58) Field of Classification Search
   CPC ....... G11C 16/30; G11C 16/102; G11C 16/08; G11C 16/26; G11C 16/10; G11C 16/16;
   (Continued)

(56) References Cited

U.S. PATENT DOCUMENTS 6,839,798 B1    1/2005  Nagayoshi et al.
2006/0069851 A1*  3/2006  Chung ................ G06F 11/1004
                                                 711/103
(Continued)

FOREIGN PATENT DOCUMENTS

JP      2008-047155 A    2/2008
JP      2009-258925 A    11/2009

*Primary Examiner* — Tri M Hoang
(74) *Attorney, Agent, or Firm* — McDermott Will & Emery LLP

(57) ABSTRACT

The semiconductor device includes a semiconductor chip including a first nonvolatile memory including a first memory block and a second memory block, CPU controlling the first nonvolatile memory, a first switch electrically connected to the first memory block and controlling the supply of the first power supply voltage to the first memory block, a second switch electrically connected to the second memory block and controlling the supply of the first power supply voltage to the second memory block, and a second nonvolatile memory electrically connected to each of the first switch and the second switch and storing flag information for controlling the first switch and the second switch, wherein the control of each of the first switch and the second switch is performed based on flag information indicating whether program data executed by CPU is written in the first memory block and the second memory block.

15 Claims, 13 Drawing Sheets

(51) Int. Cl.
*G11C 16/08* (2006.01)
*G11C 16/26* (2006.01)
*G06F 3/06* (2006.01)
*H01L 23/495* (2006.01)

(52) U.S. Cl.
CPC .......... *G06F 3/0659* (2013.01); *G06F 3/0679* (2013.01); *G11C 16/08* (2013.01); *G11C 16/102* (2013.01); *G11C 16/26* (2013.01); *H01L 23/49575* (2013.01)

(58) Field of Classification Search
CPC ....... G11C 5/147; G06F 3/064; G06F 3/0659; G06F 3/0679; G06F 3/0604; G06F 3/0658; G06F 3/0688; H01L 23/49575; H01L 2224/49171; H01L 2224/48247; H01L 2924/181
See application file for complete search history.

(56) References Cited

U.S. PATENT DOCUMENTS

| | | | | |
|---|---|---|---|---|
| 2010/0241877 | A1* | 9/2010 | Lee | G11C 5/147 |
| | | | | 713/300 |
| 2012/0254648 | A1* | 10/2012 | Hashimoto | G06F 9/4401 |
| | | | | 713/324 |
| 2018/0082744 | A1* | 3/2018 | Park | G11C 8/14 |
| 2018/0370464 | A1* | 12/2018 | Sugisawa | B60R 16/03 |
| 2019/0355397 | A1* | 11/2019 | Ishizu | H01L 27/1225 |

* cited by examiner

SEMICONDUCTOR DEVICE AND ITS POWER SUPPLY CONTROL METHOD

CROSS-REFERENCE TO RELATED APPLICATIONS

The disclosure of Japanese Patent Application No. 2018-242324 filed on Dec. 26, 2018 including the specification, drawings and abstract is incorporated herein by reference in its entirety.

BACKGROUND

The invention relates to a semiconductor device and its power supply control method.

There is a semiconductor device having a semiconductor chip includes with a built-in microcomputer (microcontroller, microprocessor), and the semiconductor device is incorporated into automobiles, industrial equipment, household electric appliances, electronic equipment, and so on.

Recent microcomputer often includes a flash module including a flash memory which is a nonvolatile memory and a control circuit for controlling writing to and erasing from the flash memory. The microcomputer operates and is controlled in accordance with the contents of the program written in the flash memory.

Japanese Unexamined Patent Application Publication No. 2009-258925 (hereafter, Patent Document 1) discloses a memory management technology of a computer system. Further, Japanese Unexamined Patent Application Publication No. 2008-47155 (hereafter, Patent Document 2) discloses a batch erasing type nonvolatile memory technology that can also be used to store frequently rewritten data.

SUMMARY

The semiconductor device has a semiconductor chip and a plurality of external terminals electrically connected to the semiconductor chip. The plurality of external terminals include terminals to which a power supply voltage for operating the semiconductor device is supplied from an external power supply.

The power supply voltage supplied from the external power supply via the external terminals is supplied to the microcomputer incorporated in the semiconductor chip, and thereby supplied to CPU, ROM, and a flash module in the microcomputer. As a result, the power supply voltage is also supplied to the flash memory incorporated in the flash module, so that the flash memory can operate.

As described above, the supply of the power supply voltage to the flash module incorporated in the microcomputer is often the same as the power supply for supplying the power supply voltage to the entire semiconductor chip. Therefore, even if there is the control circuit built in the flash module or an unused area in which program data of the flash memory is not stored, it is difficult to stop the supply of the power supply voltage to the control circuit or the unused area.

As a result, since the power supply voltage is continuously supplied to the control circuit built in the flash module and the unused area the flash memory, there arises a problem that unnecessary consumption current becomes large. Further, as wirings in the semiconductor chip are miniaturized, the problem of an increase in leakage current cannot be ignored.

In recent years, final systems on which the semiconductor device is installed have become more complicated, and manufacturers of the semiconductor device have a strong tendency to adopt a product configuration in which the flash memory capacity is increased in order to cope with the complicated final systems. Therefore, when the capacity of the program data to be written into the flash memory by the user is small, the unused area in the flash memory becomes larger, so that the above-mentioned problem becomes more conspicuous.

An object of the present invention is to reduce power consumption of the semiconductor device.

Other objects and novel features will become apparent from the description of this specification and the accompanying drawings.

Patent Documents 1 and 2 describe a memory management technology and the batch erase type nonvolatile memory technology, but neither describe nor suggest a problem in which a consumption current or a leakage current occurs when the unused area of the flash memory mounted on the microcomputer exists.

According to one embodiment, a semiconductor device comprising a semiconductor chip including a first nonvolatile memory having a first memory block and a second memory block, CPU controlling the first nonvolatile memory, a first switch electrically connected to the first memory block and controlling the supply of a first power supply voltage to the first memory block, a second switch electrically connected to the second memory block and controlling the supply of the first power supply voltage to the second memory block, and a second nonvolatile memory electrically connected to each of the first switch and the second switch and storing flag information for controlling the first switch and the second switch, wherein a control of each of the first switch and the second switch is performed based on the flag information indicating whether program data to be executed by CPU is written in the first memory block and the second memory block.

Further, according to one embodiment, a semiconductor device comprising a semiconductor chip including a first nonvolatile memory having a first memory block and a second memory block on the side A, and a third memory block and a fourth memory block on the side B, CPU electrically connected to the first memory block, a first switch electrically connected to the first memory block and controlling a supply of a first power supply voltage to the first memory block, a second switch electrically connected to the second memory block and controlling a supply of the first power supply voltage to the second memory block, a third switch electrically connected to the third memory block and controlling a supply of the first power supply voltage to the third memory block, a fourth switch electrically connected to the fourth memory block and controlling a supply of the first power supply voltage to the fourth memory block, a second nonvolatile memory electrically connected to each of the first switch, the second switch, the third switch, and the fourth switch, and in which flag information for controlling the first switch, the second switch, the third switch, and the fourth switch is stored, and a plurality of discrimination circuits discriminating the side A or the side B and electrically connected to each of the first switch, the second switch, the third switch, and the fourth switch, wherein the discrimination circuits discriminate whether or not program data to be executed by CPU is written to the side A and the side B based on the flag information, and the control of the first switch, the second switch, the third switch, and the fourth switch is executed based on a discrimination result of the discrimination circuit.

According to an embodiment, a power supply control method of a semiconductor device comprising the steps of (a) reading a boot program stored in ROM by CPU, (b) after the step (a), reading flag information for controlling a first switch electrically connected to a first memory block of a first nonvolatile memory and a second switch electrically connected to a second memory block of the first nonvolatile memory by CPU from a second nonvolatile memory; and (c) after the step (b), controlling the first switch and the second switch based on the flag information, whereby CPU controls a supply of a first power supply voltage to the first memory block and a supply of the first power supply voltage to the second memory block, wherein the flag information is information indicating whether program data to be executed by CPU has been written to the first memory block and the second memory block.

DETAILED DESCRIPTION

Hereinafter, embodiments of the present invention are described in detail with reference to the drawings. Note that components having the same function are denoted by the same reference symbols throughout the drawings for describing the embodiment, and the repetitive description thereof is omitted.

<Overview of Semiconductor Device Configuration>

Figure 1:
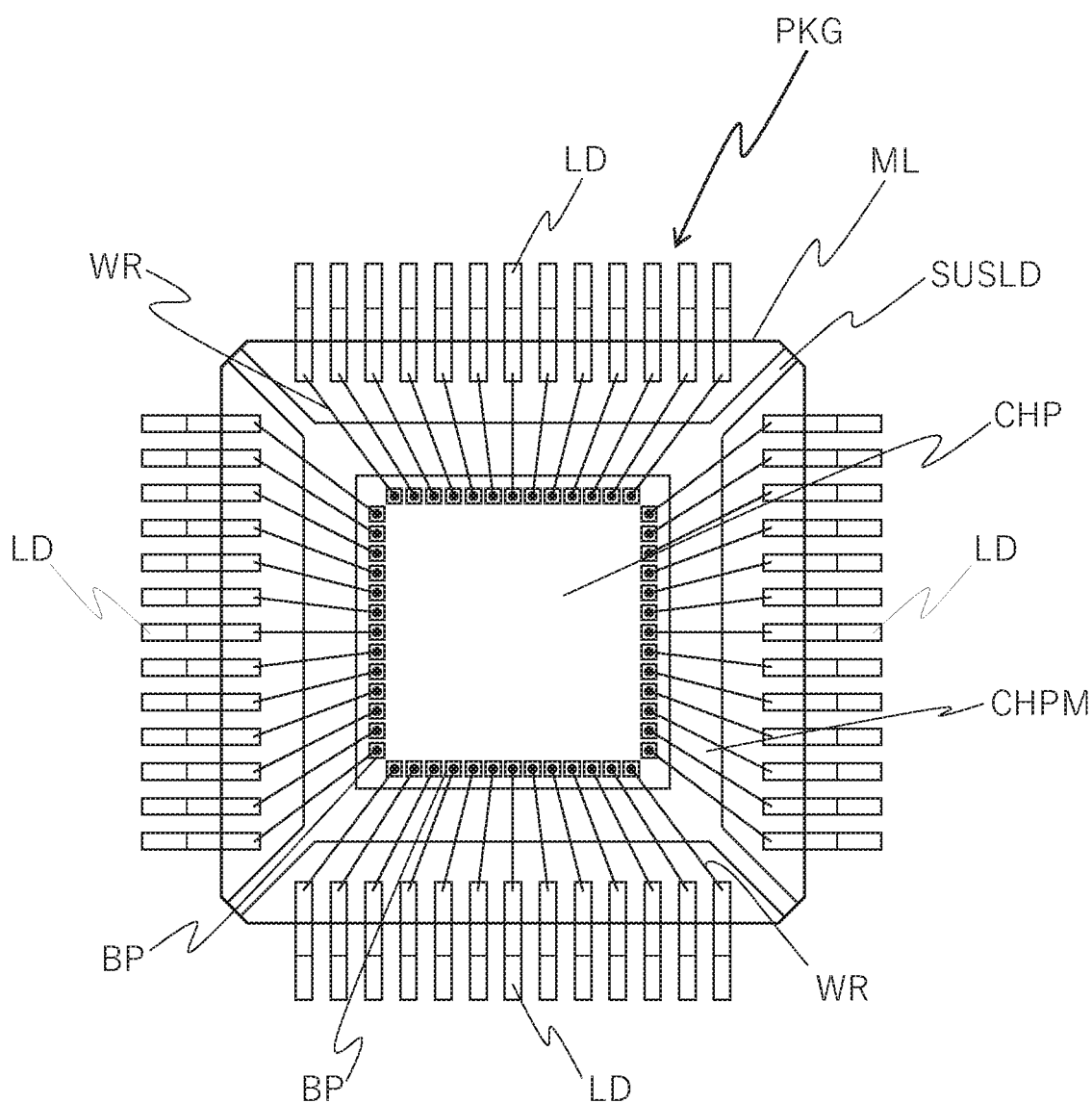
FIG. 1 is a plan view showing a configuration of a semiconductor device according to one embodiment.
Figure 2:
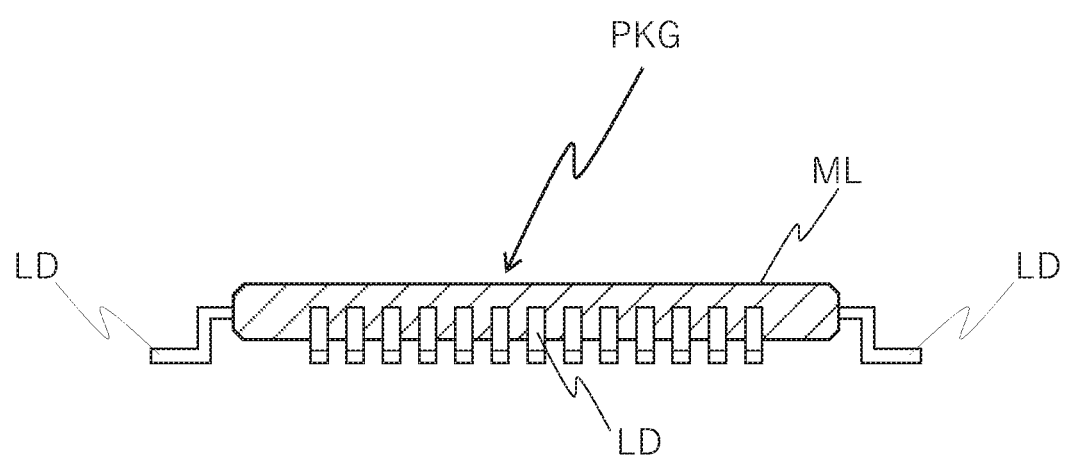
FIG. 2 is a side view showing a configuration of a semiconductor device according to one embodiment.

FIG. 1 is a plan view showing a configuration of a semiconductor device PKG according to the present embodiment. FIG. 2 is a side view showing a configuration of the semiconductor device PKG related to the present embodiment. The semiconductor device PKG shown in FIGS. 1 and 2 are exemplified here by QFP (Quad Flat Package).

In FIG. 1, CHP denotes a semiconductor chip. The semiconductor chip CHP is manufactured by forming various circuit blocks on a semiconductor wafer (semiconductor substrate) using a wafer processing manufacturing technology and cutting the semiconductor wafer into chips.

The semiconductor chip CHP is mounted on a top surface of a metal chip mounting portion CHPM, a bottom surface of the semiconductor chip CHP and the top surface of the chip mounting portion CHPM are fixed each other via an adhesive (not shown). Four suspension leads SUSLD are integrally formed and arranged at the corners of the chip mounting portion CHPM.

As shown in FIG. 1, a plurality of lead terminals LD, which are external terminals, are disposed around the chip mounting portion CHPM so as to surround the semiconductor chip CHP. Each of the plurality of lead terminals LD is formed of the same metal as the metal of the chip mounting portion CHPM.

A plurality of bonding pads BP are disposed on a top surface of the semiconductor chip CHP, which is a surface opposite the bottom surface of the semiconductor chip CHP. The bonding pads BP are electrically connected to circuit blocks formed in the semiconductor chip CHP. Further, the plurality of bonding pads BP are electrically connected to the plurality of lead terminals LD via metal wires WR.

The semiconductor chip CHP, the chip mounting portion CHPM, and each part of the plurality of leads LD to which the wires WR are connected is sealed with a sealing body ML mainly composed of epoxy resin. The planar shape of the sealing body ML is a square shape as shown in FIG. 1.

The portions of the plurality of leads LD to which the wires WR are not connected protrude from side surfaces of the sealing body ML as shown in FIGS. 1 and 2. Further, the portions of the plurality of leads LD protruding from the side surfaces of the sealing body ML are formed into a gull wing shape. The end portions of the plurality of leads LD formed into the gull-wing shape are soldered and electrically connected to terminals of a wiring substrate when the semiconductor device PKG is mounted on the wiring substrate. The wiring substrate with the semiconductor device PKG mounted is finally incorporated into automobiles, industrial equipment, household electric appliances, electronic equipment, and so on.

<Outline of Circuit Configuration Inside Semiconductor Chip>

Figure 3:
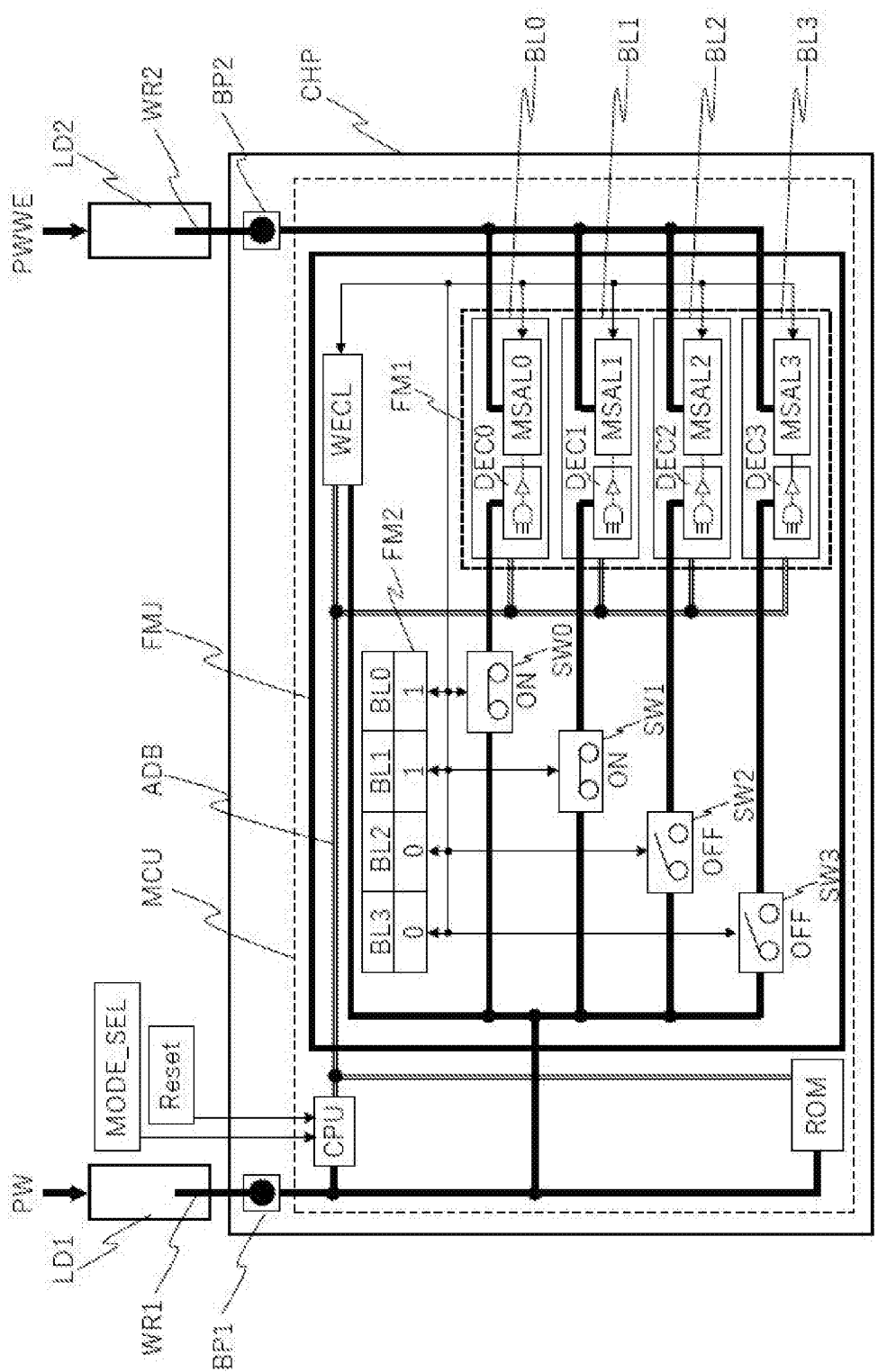
FIG. 3 is a circuit block diagram of a plurality of circuits formed in a semiconductor chip according to one embodiment.

FIG. 3 is a circuit diagram of a plurality of circuits formed in the semiconductor chip CHP related to the present embodiment. A microcomputer MCU (Microcontroller, Microprocessor) is built in the semiconductor chip CHP. The microcomputer MCU includes CPU (Central Processing Unit), a flash module FMJ, and ROM (Read Only Memory). CPU, the flash module FMJ, and ROM are electrically connected to each other via wirings formed in the semiconductor chip CHP.

The flash module FMJ includes a first flash memory FM1 which is a first nonvolatile memory, a second flash memory FM2 which is a second nonvolatile memory, a control circuit WECL which controls writing and erasing of program data to and from the first flash memory FM1, and a plurality of power supply control switches SW0, SW1, SW2, and SW3.

The first flash memory FM1 includes a plurality of memory blocks BL0, BL1, BL2, and BL3. Further, each of the plurality of memory blocks BL0, BL1, BL2, and BL3 includes a plurality of decoder circuits DEC0, DEC1, DEC2, and DEC3, and memory cell arrays MSAL0, MSAL1, MSAL2, and MSAL3 electrically connected to outputs of the decoder circuits DEC0, DEC1, DEC2, and DEC3.

CPU, ROM, the control circuit WECL in the flash module FMJ, and the plurality of memory blocks BL0, BL1, BL2, and BL3 of the first flash memory FM1 are electrically connected by CPU address bus and data bus ADB, respectively. The CPU address bus and the data bus ADB are wirings formed in the semiconductor chip CHP.

CPU, ROM, the control circuit WECL and the respective decoders DEC0, DEC1, DEC2, and DEC3 of the memory blocks BL0, BL1, BL2, and BL3 of the first flash memory FM1 are electrically connected to a bonding pad BP1 by the wirings in the semiconductor chip CHP. The bonding pad BP1 is electrically connected to a lead terminal LD1 via a wire WR1. As a result, first power supply voltage is supplied from a power supply PW provided outside the semiconductor device PKG to CPU, ROM, the control circuit WECL, and respective decoder circuits of the memory blocks BL0, BL1, BL2, and BL3 of the first flash memory FM1 via the lead terminal LD1.

Further, each of the plurality of power supply control switches SW0, SW1, SW2, and SW3 is electrically connected to the input portion of the respective decoder circuits DEC0, DEC1, DEC2, and DEC3 of the memory blocks BL0, BL1, BL2, and BL3 of the first flash memory FM1. Thus, the supply of the first power supply voltage to the decoder circuits DEC0, DEC1, DEC2, and DEC3 is controlled by ON/OFF of each of the plurality of power supply control switches SW0, SW1, SW2, and SW3.

The second flash memory FM2 in the flash module FMJ is electrically connected to the plurality of power supply control switches SW0, SW1, SW2, SW3, and the memory cell array MSAL of each of the memory blocks BL0, BL1, BL2, and BL3 of the first flash memory FM1 via the wirings formed in the semiconductor chip CHP. As a result, the ON/OFF of each of the plurality of power supply control switches SW0, SW1, SW2, and SW3 are controlled in accordance with the flag information written in the second flash memory FM2.

Each of the memory cell arrays MSAL of the memory blocks BL0, BL1, BL2, and BL3 of the first flash memory FM1 is electrically connected to the bonding pad BP2 by the wirings in the semiconductor chip CHP. The bonding pad BP2 is electrically connected to the lead terminal LD2 via a wire WR2. As a result, second power supply voltage for writing program data to and erasing program data from the flash memory write/erase power supply PWWE provided outside the semiconductor device PKG is supplied to the memory cell arrays MSAL of the memory blocks BL0, BL1, BL2, and BL3 via the read LD2.

In the above, several features have been described so far based on FIG. 3. Among these features, a typical feature is that the plurality of power supply control switches SW0, SW1, SW2, and SW3 controlled in accordance with flag information stored in the second flash memory FM2 and the second flash memory FM2 are provided to enable ON/OFF control of the supply of the first power supply voltage for each of the memory blocks BL0, BL1, BL2, and BL3 of the first flash memory FM1.

Figure 4:
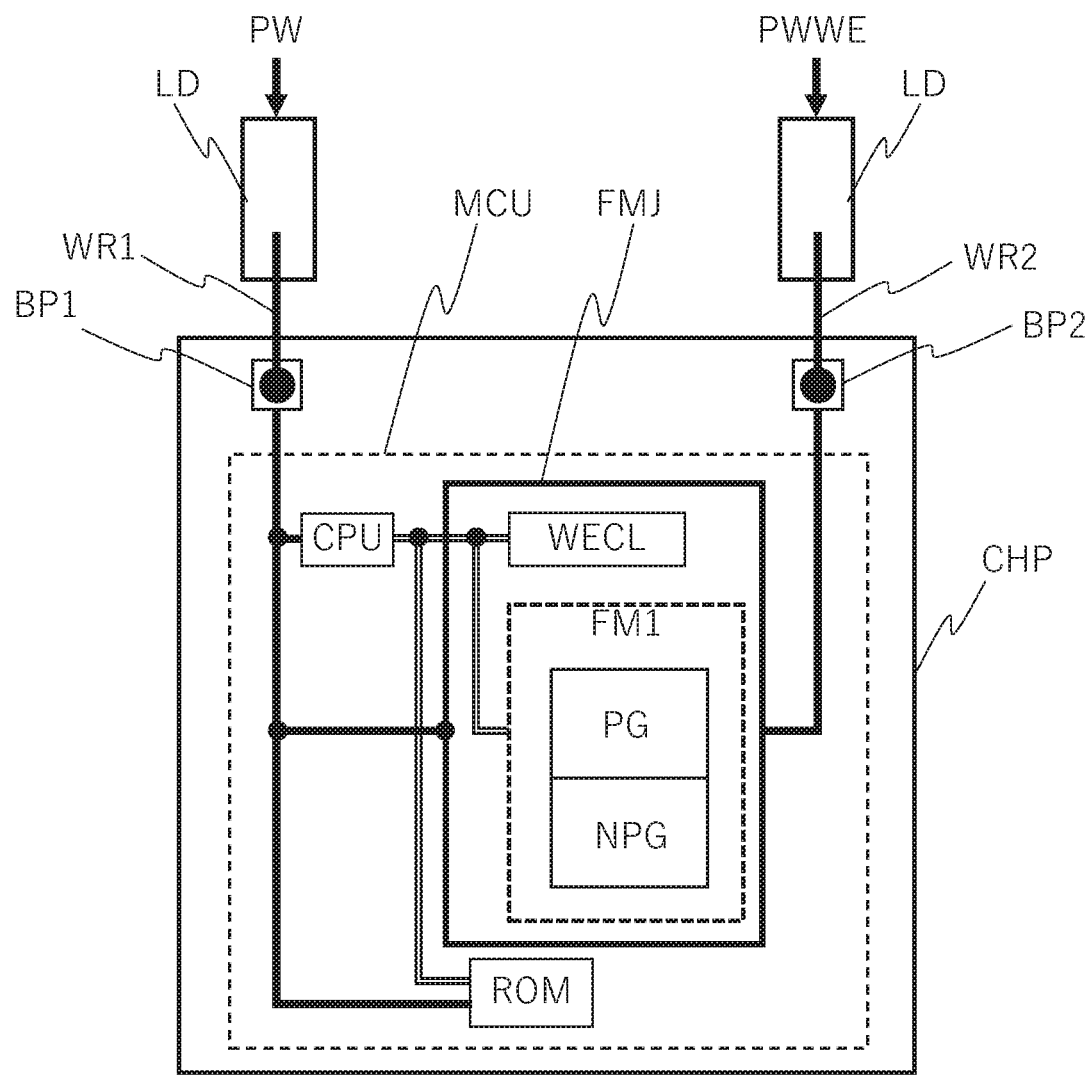
FIG. 4 is a circuit block diagram investigated by the inventors.

FIG. 4 is a circuit block diagram investigated by the inventors prior to finding the circuit block diagram of FIG. 3. The technical problem found by the inventors is described below with reference to FIG. 4.

The circuit diagram of FIG. 4 does not include the above described the second flash memory FM2 and the plurality of power supply control switches SW0, SW1, SW2, and SW3 which are controlled in accordance with the flag information stored in the second flash memory FM2.

A program data use area PG of the first flash memory FM1 in the flash module FMJ shown in FIG. 4 indicates an area in which program data for operating the microcomputer MCU is stored, and a program data unused area NPG indicates an area in which program data is not stored, in other words, a so-called blank area. The supply of the first power supply voltage to the flash module FMJ incorporated in the microcomputer MCU is common to the power supply PW that supplies the first power supply voltage to the entire semiconductor chip CHP. Therefore, even if the control circuit WECL that is not operating or the program data unused area NPG exists in the first flash memory FM1, the supply of the first power supply voltage cannot be stopped. That is, even if the program data unused area NPG exists in the first flash memory FM1 after the user of the semiconductor device PKG writes the program data in the first flash memory FM1, the area is constantly energized.

As a result, since the first power supply voltage is continuously supplied to the control circuits WECL incorporated in the flash modules FMJ and the program data unused areas NPG in the first flash memory FM1, unnecessary consumption current increases. Further, as the wirings in the semiconductor chip CHP are miniaturized, the problem of an increase in leakage current cannot be ignored.

Particularly in recent years, final systems on which the semiconductor device PKG is mounted become complicated, and manufacturers of the semiconductor device PKG have a strong tendency to adopt a product configuration in which the first flash memory FM1 has a large capacity in order to cope with the complicated final systems. Therefore, when the capacity of the program data written by the user is small, the program data unused area NPG of the first flash memory FM1 further increases, and the above described problems of the consumption current and the leakage current become more conspicuous. In order to solve the problems described above, the inventors have found the circuit block diagram shown in FIG. 3.

Details of representative features are described below with reference to FIG. 3. Here, of the memory blocks BL0, BL1, BL2, and BL3 of the first flash memory FM1, it is assumed that the memory blocks BL0 and BL1 are the program data use area PG, and the memory blocks BL2 and BL3 are the program data unused area NPG.

At this time, the flag information of "1" defining that the memory blocks BL0 and BL1 of the first flash memory FM1 are the program data use area PG, and the flag information of "0" defining that the memory blocks BL2 and BL3 of the first flash memory FM1 are the program data unused area NPG are written in the second flash memory FM2.

Based on the flag information written in the second flash memory FM2, CPU turns on the power control switches SW0 and SW1 electrically connected to the respective input portions of the memory blocks BL0 and BL1 of the first flash memory FM1, which is program data use area PG. On the other hand, based on the flag information written in the second flash memory FM2, CPU turns off the power control switches SW2 and SW3 electrically connected to the respective input portions of the memory blocks BL2 and BL3 of the first flash memory FM1, which is the program data unused area NPG.

As a result, the first power supply voltage is not supplied to the memory blocks BL2 and BL3, which are the program data unused areas NPG of the first flash memory FM1, so that unnecessary consumption current can be reduced as compared with the case of the circuit block diagram shown in FIG. 4. Further, if the wirings in the semiconductor chip CHP are miniaturized, the leakage current from the program data unused area NPG of the first flash memory FM1 can be reduced. And, as a result, total power consumption of the semiconductor device PKG can be reduced.

Figure 5:
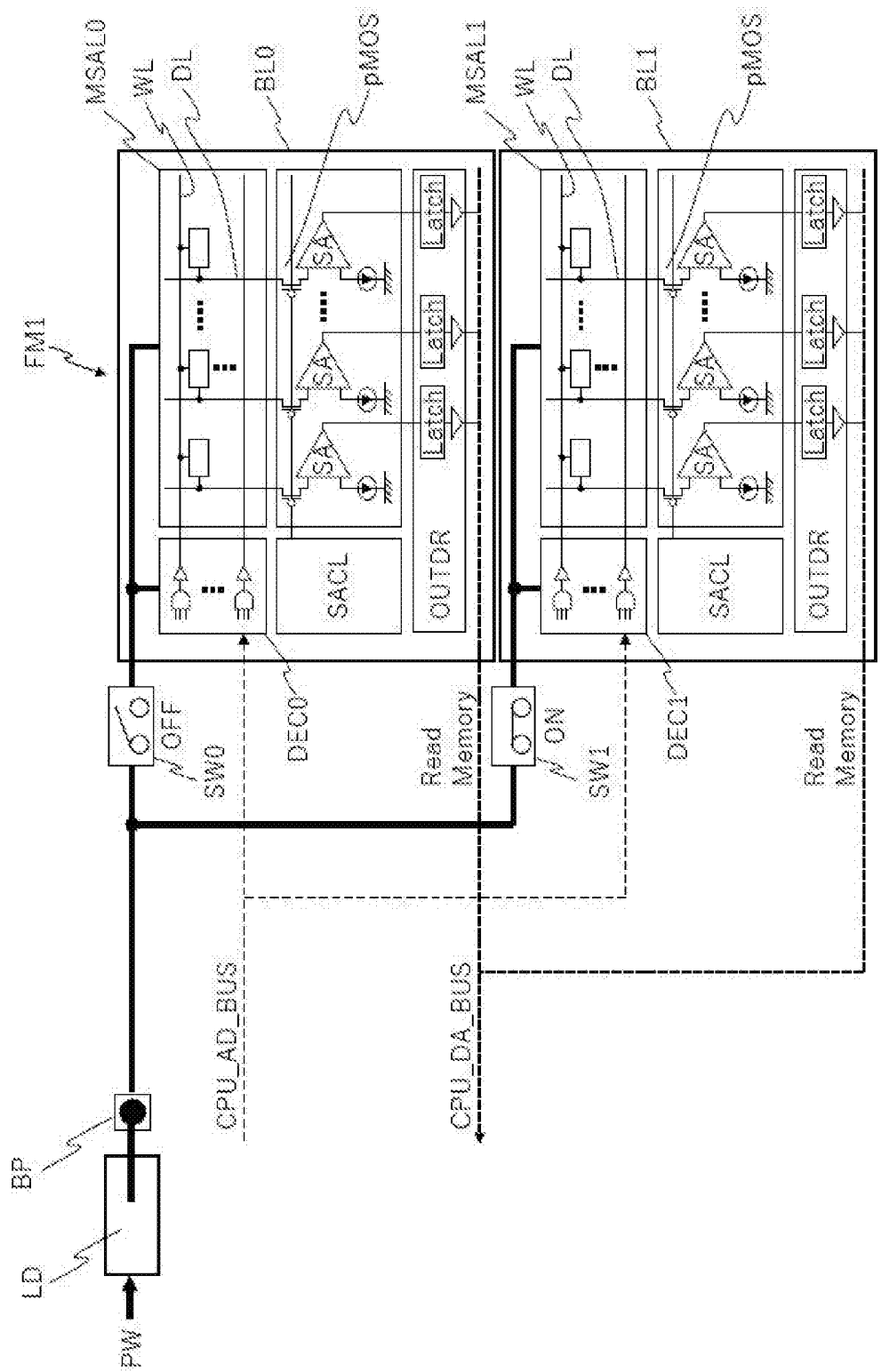
FIG. 5 is a first hard macro configuration diagram of a memory block of a flash memory according to one embodiment.

FIG. 5 is a first hard macro configuration diagram of the memory blocks BL0 and BL1 of the first flash memory FM1 according to the present embodiment. As shown in FIG. 5, each of memory blocks BL0 and BL1 includes decoder circuits DEC0 and DEC1, memory cell arrays MSAL0 and MSAL1, a plurality of sense amplifiers SA, a control circuit SACL, and an output driver OUTDR which is an output circuit.

Each of the plurality of outputs of the decoder circuits DEC0 and DEC1 is electrically connected to a plurality of word lines WL of the memory cell arrays MSAL0 and MSAL1 by the wirings in the semiconductor chip CHP. Further, the output portions of the plurality of data lines DL of the memory cell arrays MSAL0 and MSAL1 are electrically connected to the input portions of the plurality of sense amplifiers SA via transistors pMOS by the wirings in the semiconductor chip CHP.

The control circuit SACL is electrically connected to gates of the plurality of transistors pMOS by the wirings in the semiconductor chip CHP. The output portions of the plurality of sense amplifiers SA are electrically connected to a latch circuits Latch of the output drivers OUTDR by the wirings in the semiconductor chip CHP.

CPU data bus CPU_DA_BUS is electrically connected to the output portions of the output drivers OUTDR of the memory blocks BL0 and BL1, respectively, and transmits the output program data to CPU. CPU address bus CPU_AD_BUS is electrically connected to the input portions of the decoder circuits DEC of each of the memory blocks BL0 and BL1, and signals from CPU are input to the input portions of the decoder circuits DECs. The decoder circuit DEC receives a signal from CPU and transmits the processed signal to the memory cell array MSAL. CPU data bus CPU_DA_BUS and CPU address bus CPU_AD_BUS are both wirings in the semiconductor chip CHP.

As described above, by configuring each memory block of the first flash memory FM1 to be read by the sense amplifier SA for each memory cell array MSAL shown in FIG. 5, the program data stored in the memory block which is the program data use area PG can be read. Further, the supply of the first power supply voltage of the memory block, which is the program data unused area NPG, can be stopped by turning off the power supply control switch. As a result, unnecessary consumption current flowing through the memory block which is the program data unused area NPG can be reduced. As a result, total power consumption of the semiconductor device PKG can be reduced.

Figure 6:
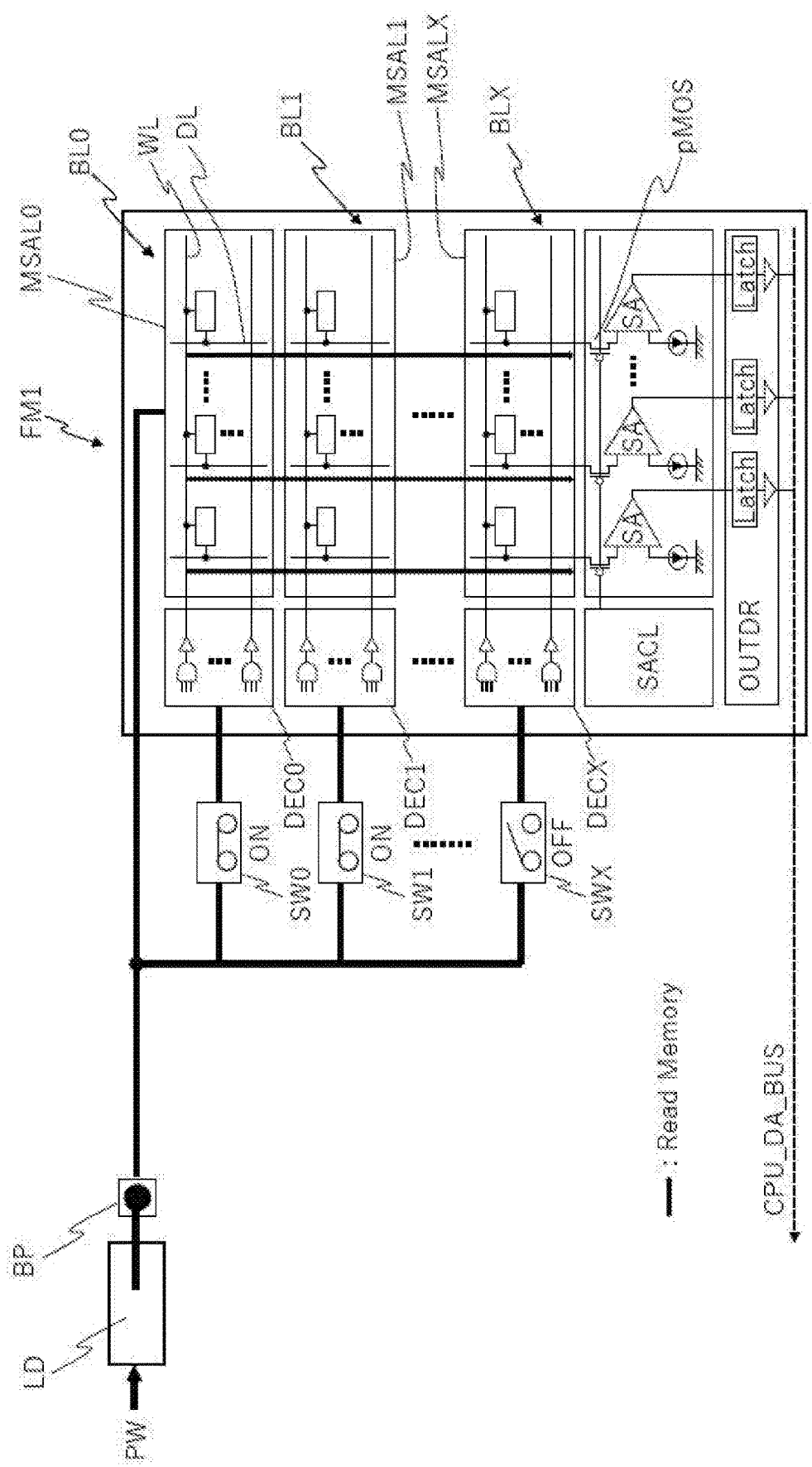
FIG. 6 is a second hard macro configuration diagram of a memory block of a flash memory according to one embodiment.

FIG. 6 is a second hard macro configuration diagram of memory blocks BL0 and BL1 of the first flash memory FM1 according to the present embodiment. The difference between the hard macro configuration of FIG. 6 and the hard macro configuration of FIG. 5 is that the memory cell arrays MSAL of the respective memory blocks are combined and stored program data is read out by one sense amplifier SA. Specifically, the word line WL of the memory cell array MSAL0 of the memory block BL0 is electrically connected to the output portion of the decoder circuit DEC0, the word line WL of the memory cell array MSAL1 of the memory block BL1 is electrically connected to the output portion of the decoder circuit DEC1, and each of the data line DL of the memory cell array MSAL0 and the data line DL of the memory cell array MSAL1 is electrically connected to the input portions of the plurality of sense amplifiers SA via the transistor pMOS.

In this configuration, as compared with the configuration of FIG. 5, since the power supply control switches SW are not electrically connected to the plurality of memory cell arrays MSAL, the supply of the first power supply voltage from the respective memory blocks BL0 to BLX of the plurality of memory cell arrays MSAL cannot be stopped. However, in this configuration, since the power supply control switches are electrically connected to arbitrary decoder circuits DEC connected to each of the plurality of memory cell arrays MSAL and to arbitrary peripheral control circuits not shown, the supply of the first power supply voltage to these circuits can be stopped. By this, unnecessary consumption current flowing through the decoder circuit DEC and the peripheral control circuits which are not used can be reduced. As a result, total power consumption of the semiconductor device PKG can be reduced.

<Semiconductor Device Power Supply Control Operation Mode>

Next, an operation mode of power supply control will be described. As shown in FIG. 3, CPU is provided with a mode cell terminal MODE_SEL for selecting the power control operation mode and a reset terminal Reset for resetting CPU.

There are two types of operation modes for performing power supply control in units of memory blocks: a "normal operation mode" and a "flash memory rewrite operation mode". Specifically, these two operation modes are switched by the mode cell terminal MODE_SEL.

Figure 7:
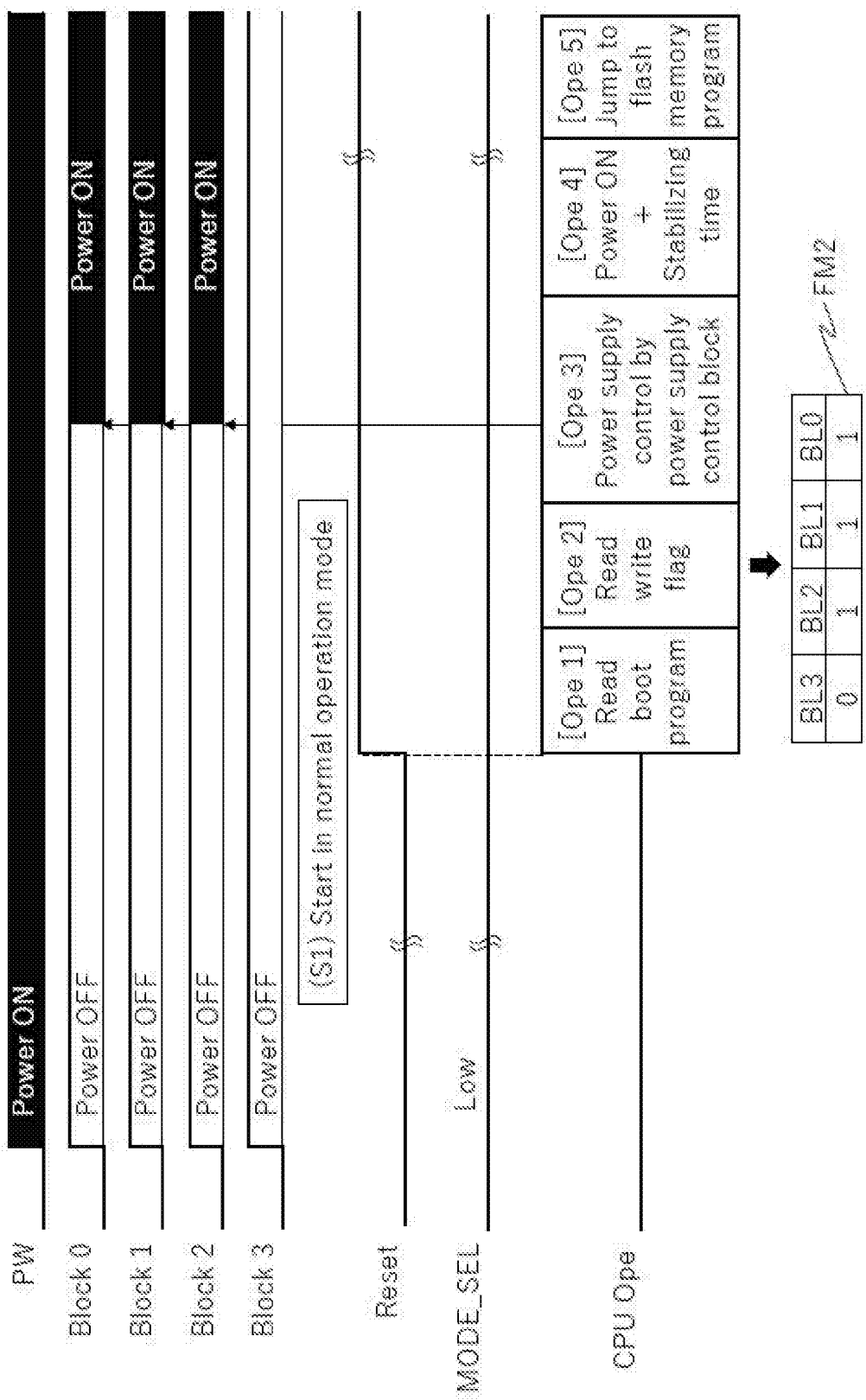
FIG. 7 is an operation timing diagram of a normal operation mode according to one embodiment.
Figure 8:
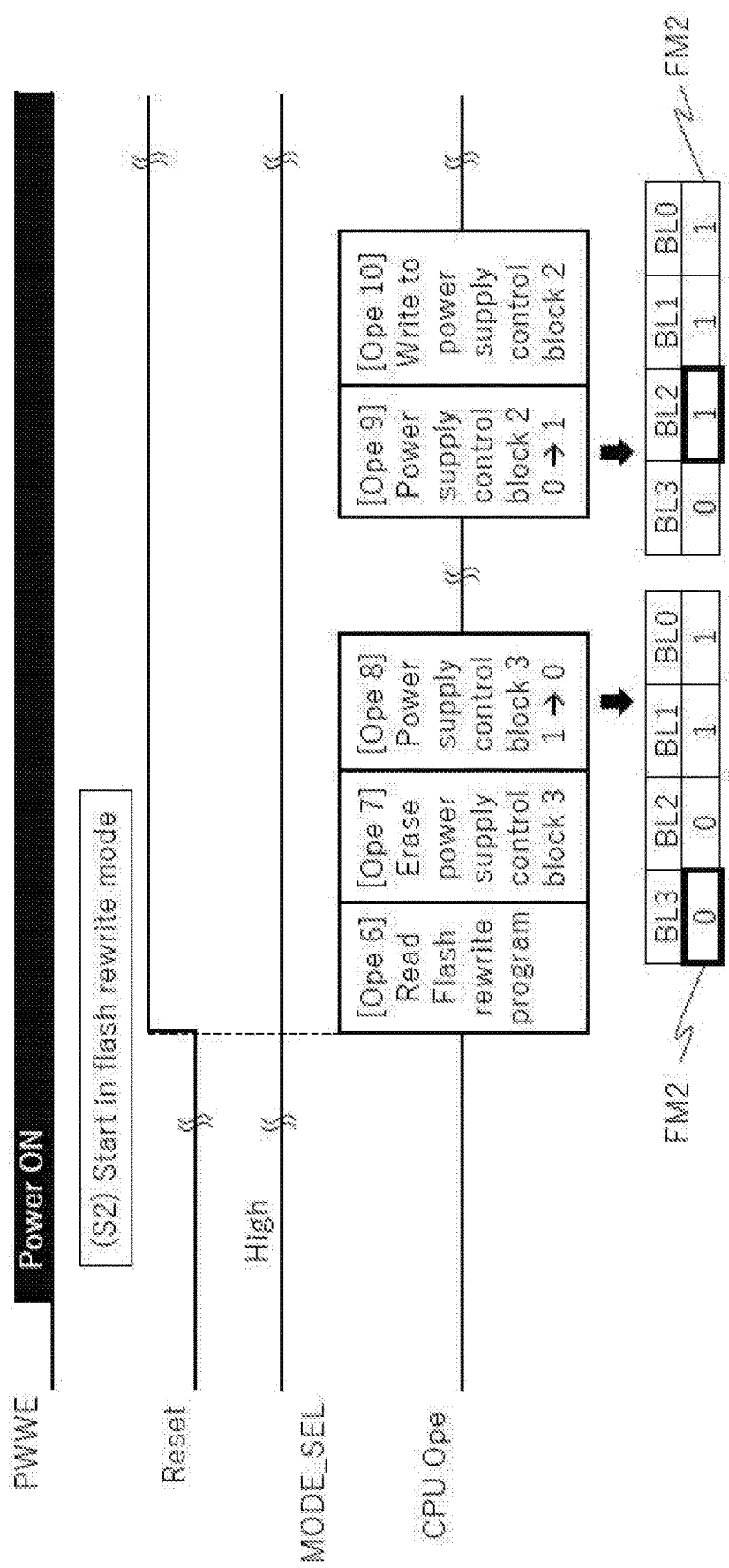
FIG. 8 is an operation timing diagram of a flash memory rewriting operation mode according to one embodiment.

FIG. 7 is an operation timing diagram of normal operation modes according to the present embodiment. FIG. 8 is an operation timing diagram of the flash memory rewrite operation mode according to the present embodiment. The normal operation mode is a mode in which CPU executes program data stored in the flash memory FM1. The flash memory rewrite operation mode is a mode in which erasing and writing of program data stored in the flash memory FM1 via CPU are performed in memory block units to be power controlled. Details of each operation mode are described below.

(Explanation of Normal Operation Mode)

The mode cell terminal MODE_SEL shown in FIG. 3 is set low, and reset signals are inputted to the reset terminal Reset or the microcomputer MCU to release the reset of the microcomputer MCU and start the microcomputer MCU (S1 in FIG. 7).

CPU reads a boot program stored in ROM of FIG. 3 in advance (Ope1 of FIG. 7) and reads flag information set for each memory block of the second flash memory FM2 through the control circuit WECL of FIG. 3 (Ope2 in FIG. 7). The memory blocks whose flag information is "1" are the memory blocks BL0, BL1, and BL2, and the power supply control switches SW0, SW1, and SW2 connected to the memory blocks are turned on. The memory block having the flag "0" is the memory block BL3 here, and the power supply control switch SW3 connected to the memory block BL3 is turned off (Ope3 and Ope4 in FIG. 7).

Thereafter, CPU jumps to the program stored in the first flash memory FM1, and CPU starts operation (Ope5 in FIG. 7).

(Explanation of Flash Memory Rewrite Operation Mode)

The erasing of the memory block BL3 and the writing of the memory block BL2 will be exemplified.

First, the second power supply voltage is supplied from the flash memory write/erase power supply PWWE to the memory cell arrays MSAL of the plurality of memory blocks BL0, BL1, BL2, and BL3 of the first flash memory FM1, respectively.

Next, the mode cell terminal MODE_SEL is turned High, and reset signals are inputted to the reset terminal Reset or the microcomputer MCU to cancel the reset of the microcomputer MCU, thereby starting the microcomputer MCU (S2 in FIG. 8).

CPU reads the flash rewrite program stored in ROM of FIG. 3 (Ope6 in FIG. 8).

CPU erases the program data of the memory block BL3 to be erased in the first flash memory FM1 (Ope1 in FIG. 8). Thereafter, CPU sets the flag information of the memory blocks BL3 of the second flash memory FM2 to "OFF (0)" (Ope8 in FIG. 8).

Then, CPU sets the flag information of the memory blocks BL2 of the second flash memory FM2 to "ON (1)" (Ope9 in FIG. 8). Thereafter, CPU writes predetermined program data into the memory blocks BL2 of the first flash memory FM1 (Ope10 in FIG. 8).

As described above, the "normal operation mode" and the "flash memory rewrite operation mode" have been described as the operation modes for performing the power supply control in units of memory blocks. The program for controlling the operations of the second flash memory FM2 and the power supply control switches of the respective memory blocks of the first flash memory FM1 is, as described above, stored in advance as a booting program of ROM. Therefore, the user can easily use the semiconductor device PKG without being aware of the control by the user.

(Explanation of the Modified Example of the Normal Operation Mode)

In addition, at the time of the normal operation mode, CPU controlled the power supply control switches connected to each memory block of the first flash memory FM1 based on the flag information set for each memory block of the second flash memory FM2 by the boot program stored in ROM, but based on the flags information set for each memory block of the second flash memory FM2, the control circuit WECL may control the power supply control switches.

Figure 9:
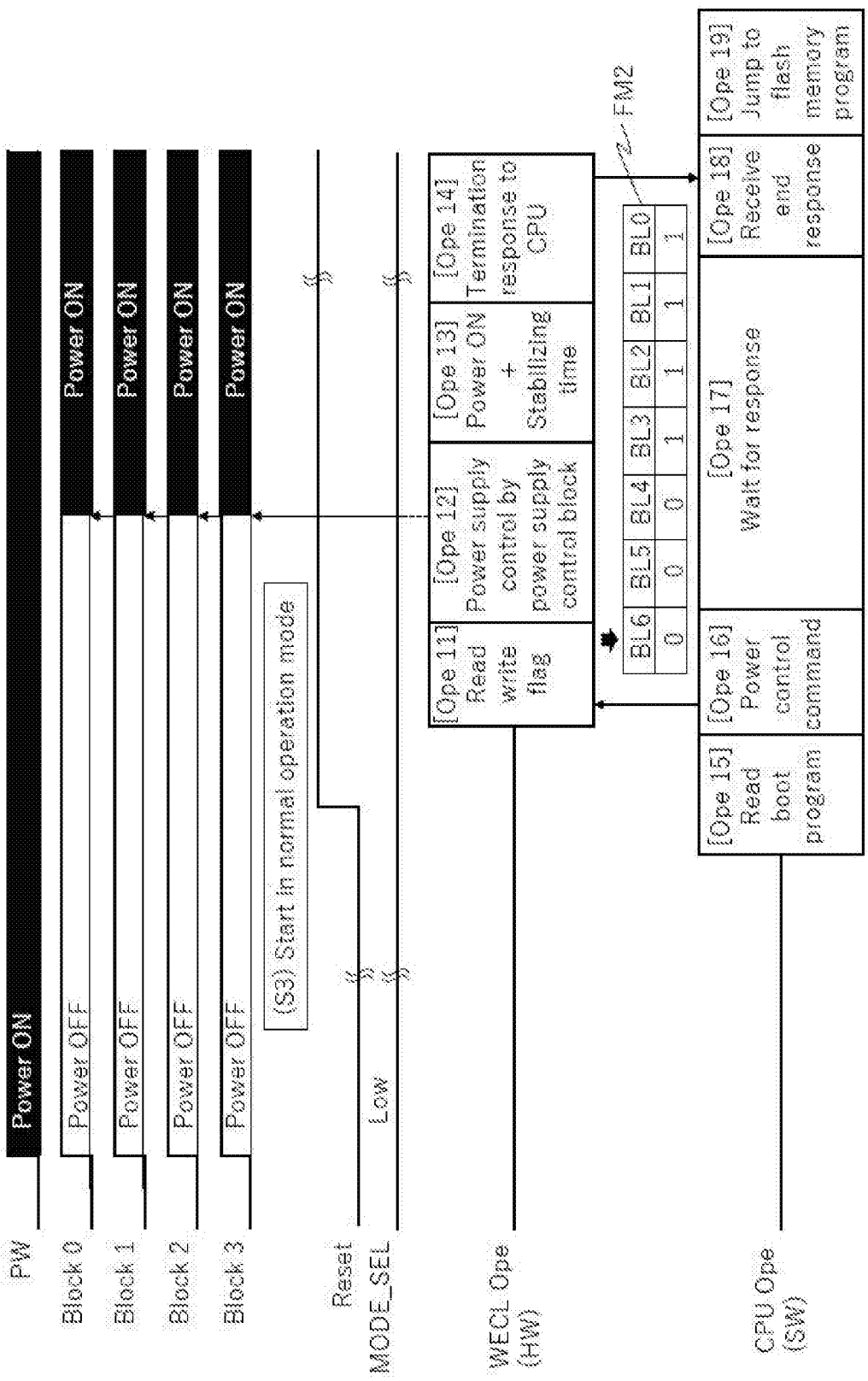
FIG. 9 is an operation timing chart of a control circuit and CPU in a normal operation mode according to one embodiment.

FIG. 9 is an operation timing chart of the control circuits WECL and CPU in the normal operation mode according to the present embodiment. The mode cell terminal MODE_SEL shown in FIG. 3 is set to Low, and reset signals are inputted to the reset terminal Reset or the microcomputer MCU to cancel the reset of the microcomputer MCU and start the microcomputer MCU (S3 in FIG. 9).

CPU reads a boot program stored in ROM shown in FIG. 3 in advance (Ope15 in FIG. 9) and issues a power control command to the control circuit WECL (Ope16 in FIG. 9). After receiving the power control command from CPU, the control circuit WECL reads the flag information set for each of the memory blocks of the second flash memory FM2 (Ope11 in FIG. 9). The memory blocks whose flag information is "1" are, here, the memory blocks BL0, BL1, BL2, and BL3, and the power control switches SW0, SW1, SW2, and SW3 connected to the memory blocks are turned on. The memory blocks whose flag information is "0" are the memory blocks BL4, BL5, and BL6, and the power supply control switches SW4, SW5, and SW6 connected to the memory blocks are turned off (Ope12 and Ope13 in FIG. 9). While the control circuit WECL performs these settings, CPU wait for responses from the control circuit WECL (Ope17 in FIG. 9).

When the setting of the control circuit WECL is completed, the control circuit WECL returns a completion response to CPU (Ope14 in FIG. 9).

After receiving the completion response from the control circuit WECL (Ope18 in FIG. 9), CPU jumps to the program stored in the first flash memory FM1 and starts the operation of the program (Ope19 in FIG. 9).

(Explanation of the Modified Example of the Flash Memory Rewriting Operation Mode)

In addition, when the flash memory rewriting operation mode, the control circuit WECL, by the instruction of CPU, may update the flags information set for each memory block of the second flash memory FM2.

Figure 10:
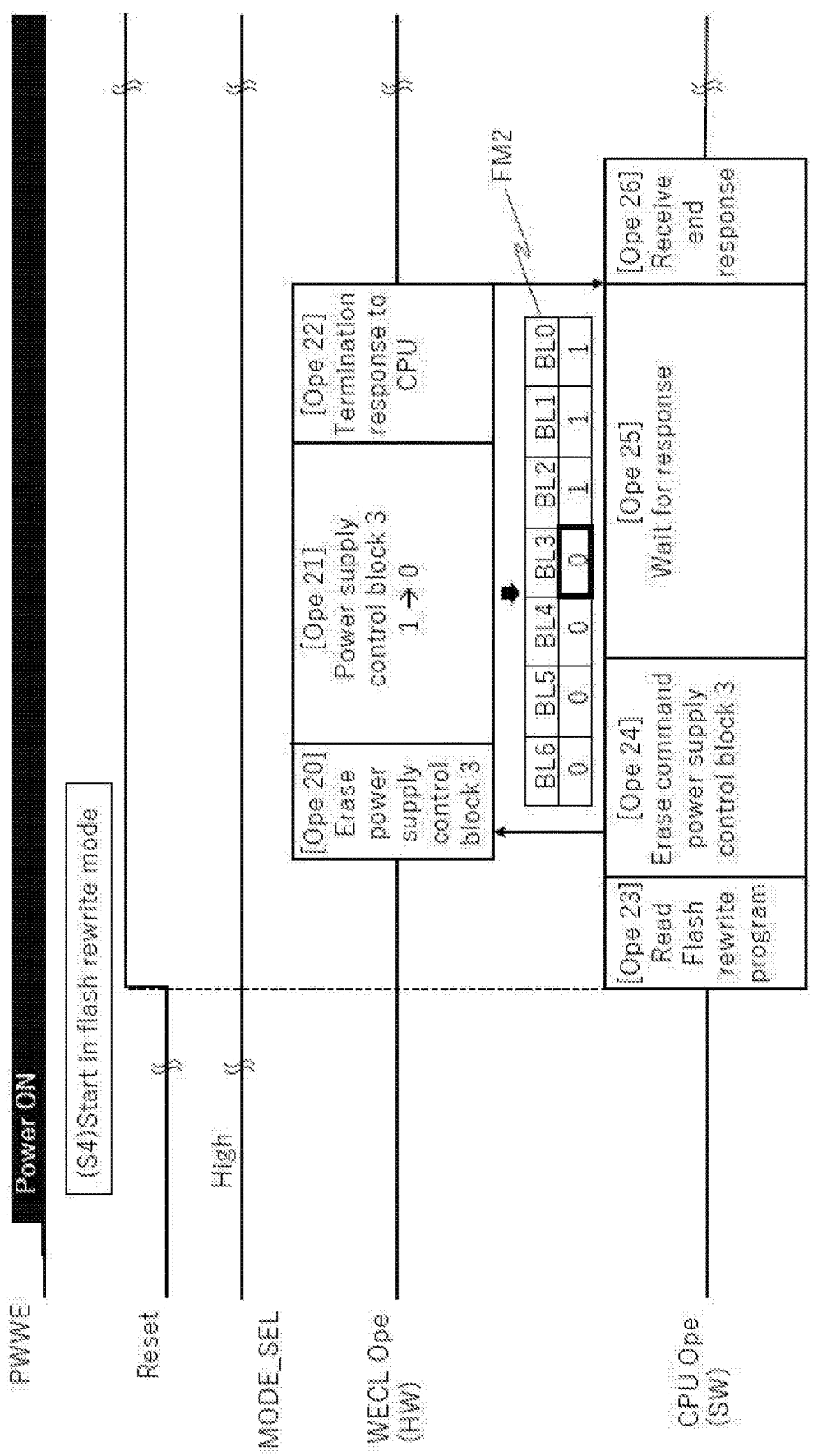
FIG. 10 is an operation timing chart of the control circuit and CPU when flag information is erased in a flash memory rewrite operation mode according to one embodiment.

FIG. 10 is an operation timing chart of the control circuits WECL and CPU when the flag information is erased in the flash memory rewrite operation mode according to the present embodiment.

First, the second power supply voltage is supplied from the flash memory write/erase power supply PWWE to the memory cell arrays MSAL of the plurality of memory blocks BL0 to BL6 of the first flash memory FM1.

Next, the mode cell terminal MODE_SEL is turned High, and reset signals are inputted to the reset terminal Reset or the microcomputer MCU to cancel the reset of the microcomputer MCU and start the microcomputer MCU (S4 in FIG. 10).

CPU reads the flash rewrite program stored in ROM shown in FIG. 3 (Ope23 in FIG. 10). And, CPU issues an instruction to erase the flag information of the memory block BL3 to the control circuit WECL (Ope24 in FIG. 10).

After receiving the command to erase the flag information from CPU, the control circuit WECL erases the program data of the memory block BL3 to be erased from the first flash memory FM1 (Ope20 in FIG. 10). Then, the control circuit WECL sets the flag information of the memory block BL3 of the second flash memory FM2 to "OFF (0)" (Ope21 in FIG. 10). While the control circuit WECL performs these settings, CPU wait for responses from the control circuit WECL (Ope25 in FIG. 10).

When the setting of the control circuit WECL is completed, the control circuit WECL returns a completion response to CPU (Ope22 in FIG. 10).

When CPU receives the completion response from the control circuit WECL (Ope26 in FIG. 10), CPU ends a series of erase operations.

Figure 11:
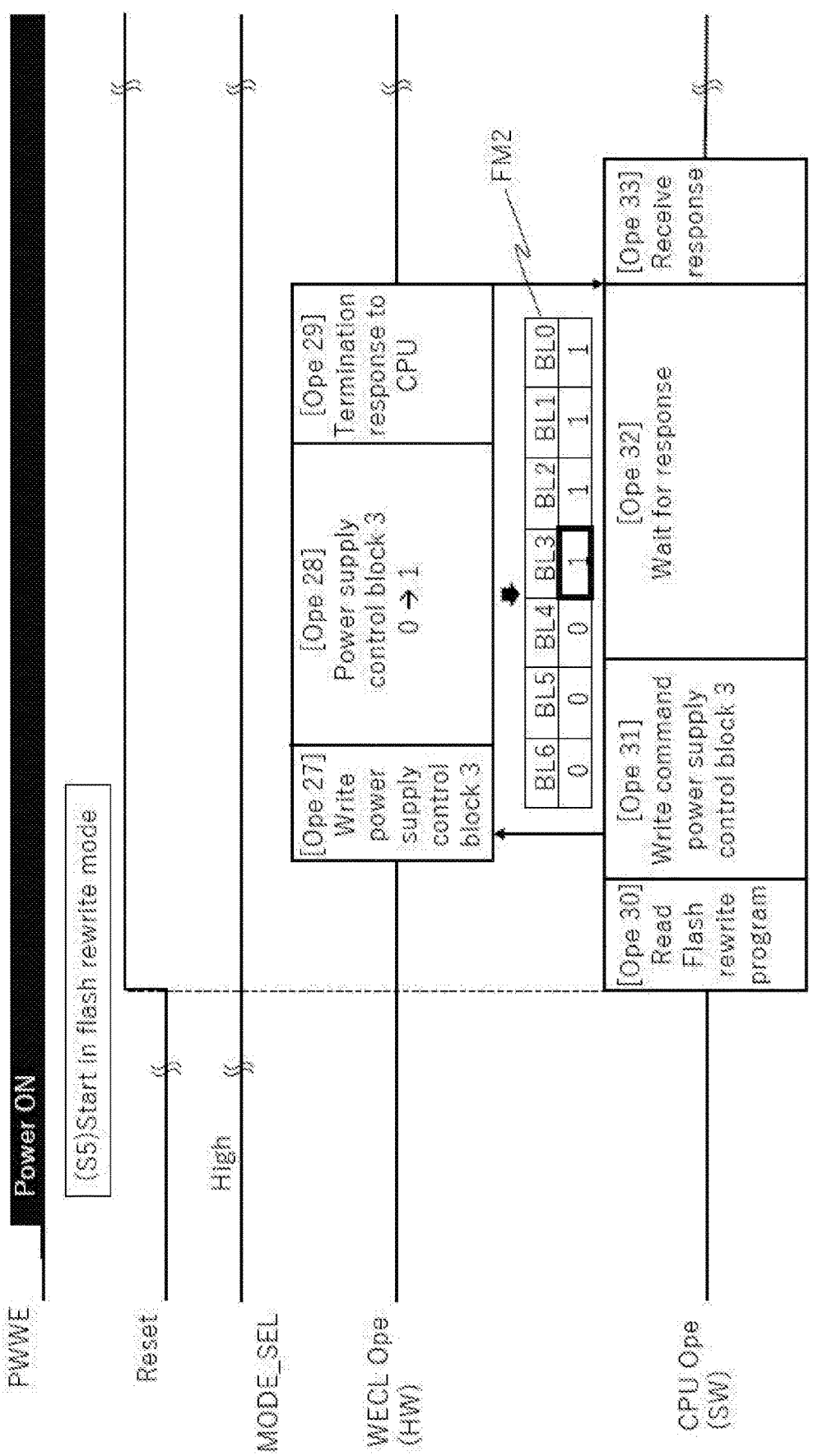
FIG. 11 is an operation timing chart of a control circuit and CPU when flag information is written in a flash memory rewrite operation mode according to one embodiment.

FIG. 11 is an operation timing chart of the control circuits WECL and CPU when the flag information is written in the flash memory rewrite operation mode according to the present embodiment.

First, the second power supply voltage is supplied from the flash memory write/erase power supply PWWE to the memory cell arrays MSAL of the plurality of memory blocks BL0 to BL6 of the first flash memory FM1.

Next, the mode cell terminal MODE_SEL is turned High, and reset signals are inputted to the reset terminal Reset or the microcomputer MCU to cancel the reset of the microcomputer MCU, thereby starting the microcomputer MCU (step S5 of FIG. 11).

CPU reads the flash rewrite program stored in ROM shown in FIG. 3 (Ope30 in FIG. 11). Then, CPU issues a command to wright the flag information of the memory block BL3 to the control circuit WECL (Ope31 in FIG. 11).

After receiving the command to write the flag information from CPU, the control circuit WECL writes predetermined program data in the memory block BL3 of the first flash memory FM1 to which the flag information is to be written (Ope27 in FIG. 11). Then, the control circuit WECL sets the flag information of the memory block BL3 of the second flash memory FM2 to "ON (1)" (Ope28 in FIG. 11). While the control circuit WECL performs these settings, CPU waits for responses from the control circuit WECL (Ope32 in FIG. 11).

When the setting of the control circuit WECL is completed, the control circuit WECL returns a completion response to CPU (Ope29 in FIG. 11).

When CPU receives an end response from the control circuit WECL (Ope33 in FIG. 11), CPU ends a series of write operations.

The modified example of each of the normal operation mode and the flash memory rewrite operation mode were described above. As a result, (1) since it is not necessary for CPU to refer to or set the flag information set for each of the memory blocks of the second flash memory FM2, the programs of the respective operation modes can be simplified. Further, (2) since it is unnecessary for CPU to refer to or set the flag information set for each memory block of the second flash memory FM2, it is unnecessary for CPU to disclose the presence of the second flash memory FM2 to the user. In addition, (3) since the control circuit WECL controls the power supply control switches based on the flag information set for each memory block of the second flash memory FM2, it is possible to shorten the startup time when the system is started in the normal operation mode as compared with the case where CPU performs the control of the power supply control switches based on the flag information set for each memory block of the second flash memory FM2. Further, (4) since the control circuit WECL sets the second flash memory FM2, the time required for erasing/writing the first flash memory FM1 can be shortened compared to the case where the CPU performs it.

<First Modified Example of the Circuit Configuration Inside the Semiconductor Chip>

Figure 12:
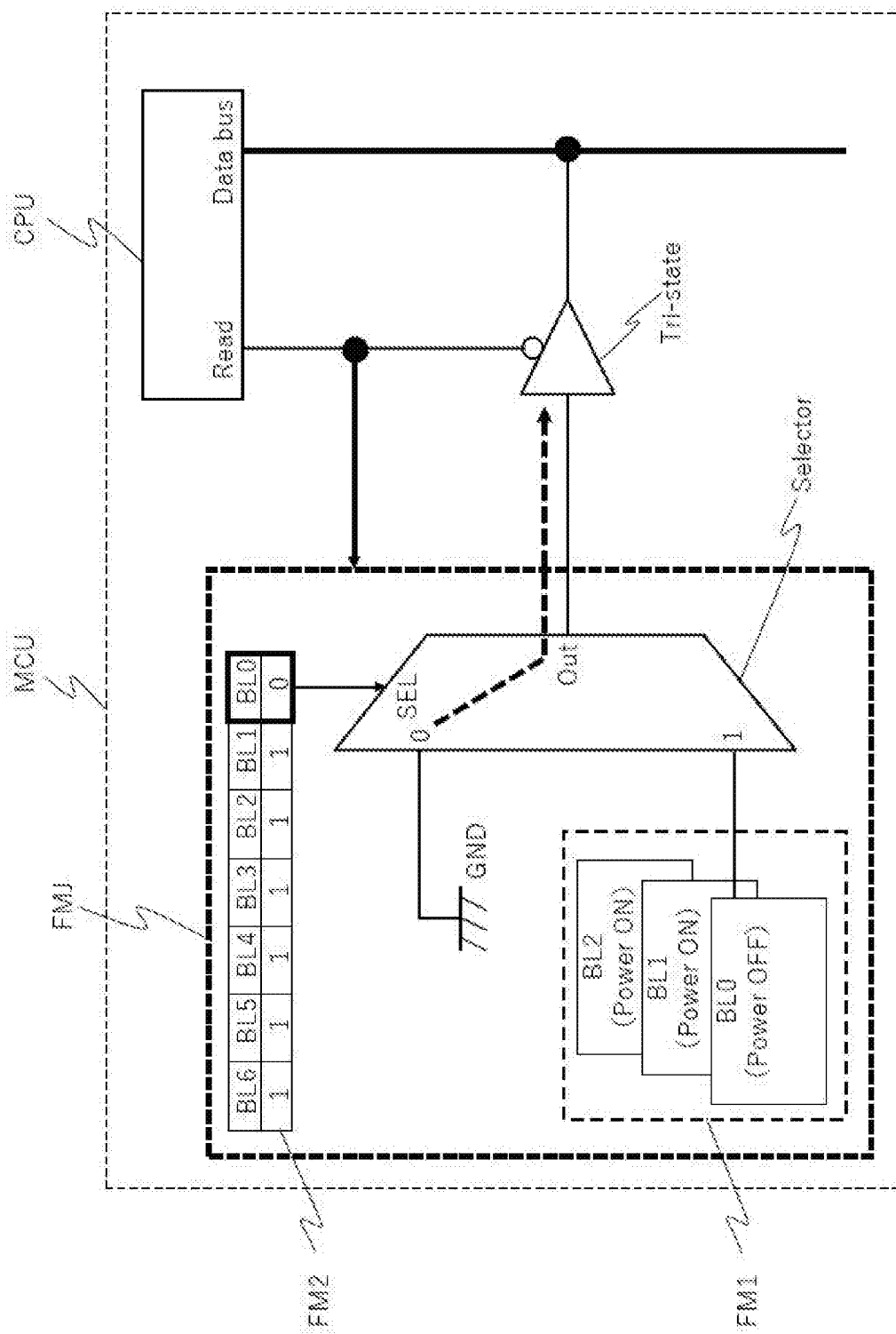
FIG. 12 is a circuit diagram for preventing a read error of the memory block in which the supply of first power supply voltage is stopped according to one embodiment.

FIG. 12 is a circuit diagram for preventing a read error of the memory block in which the supply of the first power supply voltage is stopped according to the present embodiment. So far, it has been described that the second flash memory FM2 is established, and the first power supply voltage to be supplied to the first flash memory FM1 is ON/OFF controlled for each memory block based on the flag information set for each memory block stored in the second flash memory FM2.

In this case, there is a possibility that CPU erroneously reads out the memory block to which the first power supply voltage is not supplied. Therefore, as shown in FIG. 12, a selector Selector may be provided at the outputs of the flash modules FMJ, and fixed values may be read out on the basis of the flag information for each memory block stored in the second flash memory FM2. The fixed value is preferably a Low level at which no current flows, or an undefined instruction code. As a result, even when the memory block BL0 to which the first power supply voltage is not supplied is erroneously read out, the fixed value is read out, so that it is possible to prevent a malfunction of reading out the fixed value.

<Second Modified Example of the Circuit Configuration Inside the Semiconductor Chip>

Figure 13:
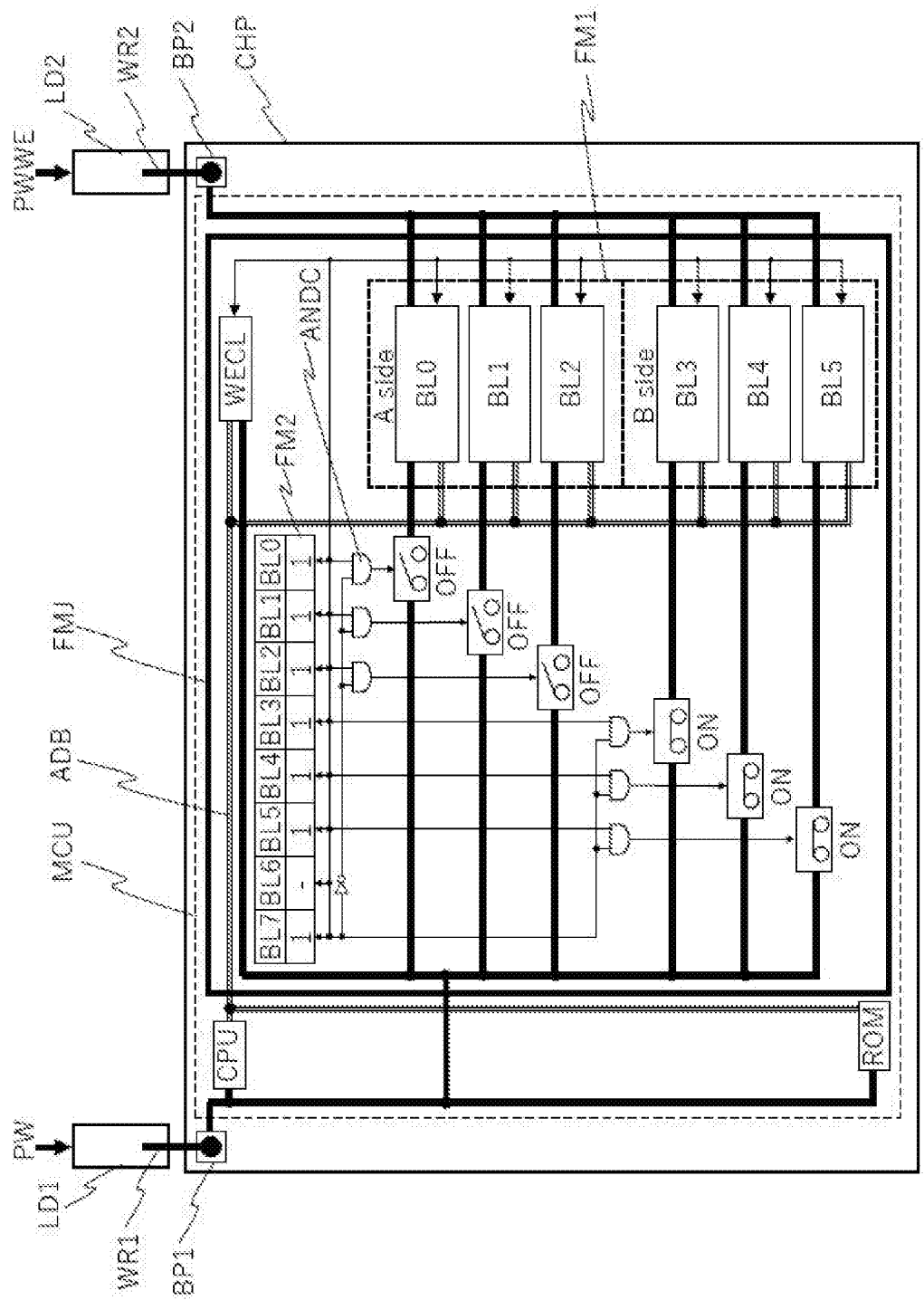
FIG. 13 is a circuit block diagram of a plurality of circuits formed in a semiconductor chip when a first flash memory is in a dual bank mode according to one embodiment.

In addition, the first flash memory FM1 may be, for example, a dual-bank mode with the side A and the side B. FIG. 13 is a circuit block diagram of a plurality of circuits formed in the semiconductor chip CHP of the present embodiment when the first flash memory FM1 is in the dual bank mode.

In this case, as shown in FIG. 13, by newly providing a 1-bit discrimination circuit for discriminating the side A and the side B in the second flash memory FM2, here, flag information of the memory block BL7 and an AND circuit ANDC, the first power supply voltage can be ON/OFF controlled for each memory block.

More specifically, by providing such the discrimination circuit, the power control switch is turned off on the side in which the program data of the first flash memory FM1 is not stored, and the power control switch is turned on the side in which the program data is stored. As a result, since the first power supply voltage is not supplied to the side of the first flash memory FM1 where the program data is not stored, unnecessary consumption current can be reduced as compared with the case where the discrimination circuit is not provided. As a result, total power consumption of the semiconductor device PKG can be reduced.

When the microcomputer MCU can determine whether the microcomputer MCU uses the side A or the side B of the dual bank mode, the setting content may be reflected in the determination bits newly provided in the second flash memory FM2, in this case, the memory blocks BL7.

Although the microcomputer is mainly exemplified here, a number of features that have been described so far are not limited to the microcomputer and may be applied to semiconductor chips called System LSI or SOC (System On Chip).

Although the QFP is described as an example of the package type here, the package type is not limited to this. For example, BGA (Ball Grid Array) package or LGA (Land Grid Array) package in which semiconductor chips are mounted on an interposer substrate and electrically connected to the interposer via metal wires or bumps may be adopted. In this case, a plurality of ball electrodes and land electrodes provided on the surface opposite to the surface on which the semiconductor chip of the interposer substrate is mounted serve as external terminals.

Although the semiconductor package in which the semiconductor chip is sealed with the sealing member has been described as the semiconductor device, the semiconductor chip itself may be defined as the semiconductor device.

What is claimed is:
1. A semiconductor device comprising:
 a semiconductor chip including:
  a first nonvolatile memory having a first memory block and a second memory block;
  a Central Processing Unit (CPU) controlling the first nonvolatile memory;
  a first switch electrically connected to the first memory block and controlling a supply of a first power supply voltage to the first memory block;
  a second switch electrically connected to the second memory block and controlling the supply of the first power supply voltage to the second memory block; and
  a second nonvolatile memory electrically connected to each of the first switch and the second switch, and storing flag information for controlling the first switch and the second switch,
 wherein control of each of the first switch and the second switch is performed based on the flag information indicating whether program data to be executed by the CPU is written in the first memory block and the second memory block.

2. The semiconductor device according to claim 1, wherein when the program data is written in the first memory block while the second memory block is blank, the first switch and the second switch are controlled by the flag information defined such that the first power supply voltage is supplied to the first memory block and the first power supply voltage is not supplied to the second memory block.

3. The semiconductor device according to claim 2, wherein the flag information includes:
 first flag information defining that the first switch is to be turned on based on the program data being written in the first memory block; and
 second flag information defining that the second switch is to be turned off based on the second memory block being blank.

4. The semiconductor device according to claim 3, wherein the first memory block includes:
 a first decoder circuit to which a signal from the CPU is input;
 a first memory cell array electrically connected to an output portion of the first decoder circuit to write the program data;
 a first sense amplifier having an input portion electrically connected to the first memory cell array via a first transistor;
 a first control circuit electrically connected to a gate of the first transistor and configured to control the gate of the first transistor; and
 a first output circuit electrically connected to an output portion of the first sense amplifier to send the program data output from the first memory cell array to the CPU, and
wherein the second memory block includes:
 a second decoder circuit to which the signal from the CPU is input;
 a second memory cell array electrically connected to an output portion of the second decoder circuit to write the program data;
 a second sense amplifier having an input portion electrically connected to the second memory cell array via a second transistor;
 a second control circuit electrically connected to a gate of the second transistor and configured to control the gate of the second transistor; and
 a second output circuit electrically connected to an output of the second sense amplifier to send the program data output from the second memory cell array to the CPU.

5. The semiconductor device according to claim 4, wherein a data line of the first memory cell array is electrically connected to the input portion of the first sense amplifier via the first transistor,
wherein a word line of the first memory cell array is electrically connected to the output portion of the first decoder circuit,
wherein a data line of the second memory cell array is electrically connected to the input portion of the second sense amplifier via the second transistor, and
wherein a word line of the second memory cell array is electrically connected to the output portion of the second decoder circuit.

6. The semiconductor device according to claim 5, wherein the first switch and the second switch are electrically connected to an external terminal to which the first power supply voltage is supplied from a power supply provided externally, and wherein the semiconductor chip is sealed by a sealing member.

7. The semiconductor device according to claim 3, wherein the first memory block includes:
 a first decoder circuit to which a signal from the CPU is input; and
 a first memory cell array electrically connected to an output portion of the first decoder circuit to write the program data,
wherein the second memory block includes:
 a second decoder circuit to which the signal from the CPU is input; and
 a second memory cell array electrically connected to an output portion of the second decoder circuit to write the program data,
wherein further comprising:
 a sense amplifier having an input portion electrically connected to the second memory cell array via a transistor;
 a control circuit for controlling a gate of the transistor; and
 an output circuit electrically connected to an output portion of the sense amplifier to send the program data output from the first memory cell array or the second memory cell array to the CPU,
wherein the first switch is electrically connected to the first decoder circuit and is not electrically connected to the second decoder circuit, and
wherein the second switch is electrically connected to the second decoder circuit and is not electrically connected to the first decoder circuit.

8. The semiconductor device according to claim 7, wherein a word line of the first memory cell array is electrically connected to the output portion of the first decoder circuit,
wherein a word line of the second memory cell array is electrically connected to the output portion of the second decoder circuit, and
wherein each of data lines of the first memory cell array and data lines of the second memory cell array is electrically connected to the input portion of the sense amplifiers via the transistor.

9. The semiconductor device according to claim 8, wherein the first switch and the second switch are electrically connected to an external terminal to which the first power supply voltage is supplied from an external power supply, and the semiconductor chip is sealed by a sealing member.

10. A semiconductor device comprising:
 a semiconductor chip including:
  a first nonvolatile memory having a first memory block and a second memory block on a side A of the first nonvolatile memory, and a third memory block and a fourth memory block on a side B of the first nonvolatile memory;
  a Central Processing Unit (CPU) electrically connected to the first nonvolatile memory;
  a first switch electrically connected to the first memory block and controlling a supply of a first power supply voltage to the first memory block;
  a second switch electrically connected to the second memory block and controlling the supply of the first power supply voltage to the second memory block;
  a third switch electrically connected to the third memory block and controlling the supply of the first power supply voltage to the third memory block;

a fourth switch electrically connected to the fourth memory block and controlling the supply of the first power supply voltage to the fourth memory block;

a second nonvolatile memory electrically connected to each of the first switch, the second switch, the third switch, and the fourth switch, and in which flag information for controlling the first switch, the second switch, the third switch, and the fourth switch is stored; and a plurality of discrimination circuits discriminating the side A or the side B and electrically connected to each of the first switch, the second switch, the third switch, and the fourth switch, wherein the discrimination circuits discriminate whether or not program data to be executed by the CPU is written to the side A and the side B based on the flag information, and wherein the control of the first switch, the second switch, the third switch, and the fourth switch is executed based on a discrimination result of the discrimination circuit.

11. The semiconductor device according to claim 10, wherein the first switch, the second switch, the third switch, and the fourth switch are controlled so that the first power supply voltage is supplied to the first memory block and the second memory block, and the first power supply voltage is not supplied to the third memory block and the fourth memory block when the program data is written on the side A while the side B is blank.

12. A power supply control method of a semiconductor device comprising of:
   (a) reading a boot program stored in a Read Only Memory (ROW by a Central Processing Unit (CPU);
   (b) after the step (a), reading, by the CPU, flag information for controlling 1) a first switch electrically connected to a first memory block of a first nonvolatile memory and 2) a second switch electrically connected to a second memory block of the first nonvolatile memory, wherein the flag information is read from a second nonvolatile memory; and
   (c) after the step (b), controlling the first switch and the second switch based on the flag information, whereby the CPU controls a supply of a first power supply voltage to the first memory block and the supply of the first power supply voltage to the second memory block, wherein the flag information is information indicating whether program data to be executed by the CPU has been written to the first memory block and the second memory block.

13. The power supply control method of the semiconductor device according to claim 12, wherein the flag information includes first flag information defining that the first switch is turned on by the program data being written in the first memory block, and second flag information defining that the second switch is turned off by the second memory block being blank.

14. The power supply control method of the semiconductor device according to claim 13, wherein the semiconductor device comprises a semiconductor chip including the CPU, the ROM, the first nonvolatile memory, and the second nonvolatile memory.

15. The power supply control method of the semiconductor device according to claim 12, wherein after the step (c), the CPU retrieves the program data stored in the first nonvolatile memory to start an operation of the program data.

\* \* \* \* \*